(12) United States Patent
Liu et al.

(10) Patent No.: US 8,507,378 B2
(45) Date of Patent: Aug. 13, 2013

(54) METHOD AND STRUCTURE FOR SELF ALIGNED CONTACT FOR INTEGRATED CIRCUITS

(75) Inventors: ChiKang Liu, Shanghai (CN); ZhengYing Wei, Shanghai (CN); GuoXu Zhao, Shanghai (CN); YangFeng Li, Shanghai (CN); GuoLiang Zhu, Shanghai (CN); FangYu Yang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 360 days.

(21) Appl. No.: 12/848,068

(22) Filed: Jul. 30, 2010
(Under 37 CFR 1.47)

(65) Prior Publication Data
US 2011/0037130 A1    Feb. 17, 2011

(30) Foreign Application Priority Data
Aug. 13, 2009  (CN) .......................... 2009 1 0056517

(51) Int. Cl.
*H01L 29/772*    (2006.01)
*H01L 21/768*    (2006.01)

(52) U.S. Cl.
USPC ........... 438/637; 438/233; 438/672; 438/682; 438/675; 257/E21.507; 257/384; 257/E21.438; 257/690

(58) Field of Classification Search
USPC ................ 438/740, 233, 637, 672, 682, 675; 257/E21.507, 384, E21.438, 690
See application file for complete search history.

(56) References Cited

U.S. PATENT DOCUMENTS

| | | | | |
|---|---|---|---|---|
| 7,476,973 B2 * | 1/2009 | Kim | .............................. | 257/773 |
| 7,994,580 B2 * | 8/2011 | Tien et al. | ...................... | 257/368 |
| 2008/0122076 A1 * | 5/2008 | Hong et al. | .................... | 257/734 |

* cited by examiner

*Primary Examiner* — Matthew Reames
*Assistant Examiner* — Benjamin Tzu-Hung Liu
(74) *Attorney, Agent, or Firm* — Kilpatrick Townsend & Stockton LLP

(57) ABSTRACT

A high voltage integrated circuit device includes a semiconductor substrate having a surface region with a contact region, which is coupled to a source/drain region. The device has a plasma enhanced oxide overlying the surface region, a stop layer overlying the plasma enhanced oxide, and a contact opening through a portion of the stop layer and through a portion of the plasma enhanced oxide layer. The contact opening exposes a portion of the contact region without damaging it. The device has a silicide layer overlying the contact region to form a silicided contact region and an interlayer dielectric overlying the silicided contact region to fill the contact opening and provide a thickness of material overlying the stop layer. An opening in the interlayer dielectric layer is formed through a portion of the thickness to expose a portion of the silicided contact region and expose a portion of the stop layer.

16 Claims, 5 Drawing Sheets

METHOD AND STRUCTURE FOR SELF ALIGNED CONTACT FOR INTEGRATED CIRCUITS

BACKGROUND OF THE INVENTION

This application claims priority to Chinese Patent Application No. 200910056517.1, filed Aug. 13, 2009, entitled "A Method and Structure for Self Aligned Contact for Integrated Circuits," by inventors ChiKang Liu, ZhengYing Wei, GuoXu Zhao, YangFeng Li, GuoLiang Zhu, and FangYu Yang, commonly assigned, incorporated by reference herein for all purposes.

Embodiments of the present invention are directed integrated circuits and their processing for the manufacture of semiconductor devices. More particularly, embodiments of the invention provide a method and system for forming a self aligned contact for a high voltage semiconductor integrated circuit device. But it would be recognized that the invention has a much broader range of applicability. For example, the invention can be applied to a variety of other applications such as application specific integrated circuits, microprocessors, and memory devices.

Over the past decades, integrated circuits have evolved from a handful of interconnected devices fabricated on a single chip of silicon to millions of devices. Performance and complexity are far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits. Certain semiconductor devices are now being fabricated with features less than a quarter of a micron across.

Increasing circuit density has not only improved the complexity and performance of circuits but also provided lower costs to consumers. Conventional semiconductor fabrication plants often costs hundreds of millions or even billions of U.S. dollars to construct. Each fabrication facility has a certain capacity measured in tens of thousands of wafer starts per month. Each wafer also has a certain number of potential chips. By manufacturing individual devices smaller and smaller, more devices are packed in a given area of semiconductor, which increases output of the fabrication facility. Making devices smaller is always very challenging, as each process for the manufacture of semiconductor devices has a limit. That is to say, a given process typically only works down to a certain feature size, and then either the process or the device layout should be changed.

Costs of operating fabrication facilities have also increased dramatically. As many know, many U.S. fabrication facilities that were operable in the 1970's and 1980's no longer exist. Many of such fabrication facilities migrated to Japan in the 1980's and then to Korea and Taiwan in the 1990's. As demand for lower cost fabrication facilities continues, China has now become a choice geographic location for fabrication facilities to start up. Many companies have announced plans to begin manufacturing facilities in China. Such companies include, but are not limited to, Motorola, Inc., Taiwan Semiconductor Manufacturing Corporation of Taiwan, also called TSMC, and others. Although labor costs may be somewhat lower in China, there are still many costs that still need to be reduced or even eliminated as the demand for lower cost silicon continues!

An example of a process that has limitations based upon a given feature size is the formation of contact structures for a high voltage semiconductor device. Such contact structures include an opening that traverses through a thickness of dielectric material to an active region of the high voltage device. The active region is often a source/drain region of a specialized MOS transistor, which serves as the high voltage device. The opening, however, is often difficult to align accurately, which leads to a voltage breakdown for the specialized MOS transistor. These and other limitations of the conventional high voltage semiconductor device can be found throughout the present specification and more particularly below.

From the above, it is seen that an improved technique for processing semiconductor devices is desired.

BRIEF SUMMARY OF THE INVENTION

According to the present invention, techniques directed integrated circuits and their processing for the manufacture of semiconductor devices are provided. More particularly, embodiments of the invention provide a method and system for forming a self aligned contact for a high voltage semiconductor integrated circuit device. But it would be recognized that the invention has a much broader range of applicability. For example, the invention can be applied to a variety of other applications such as application specific integrated circuits, microprocessors, and memory devices.

A specific embodiment of the present invention provides a method for fabricating a high voltage integrated circuit device, e.g., breakdown voltage of 12 volts and greater. The method includes providing a semiconductor substrate comprising a surface region, which has a contact region. The contact region is coupled to a source/drain region of a high voltage semiconductor device. The method includes forming a plasma enhanced oxide overlying surface region and forming a stop layer overlying the plasma enhanced oxide. The method includes forming a first contact opening through a portion of the stop layer and through a portion of the plasma enhanced oxide layer. Preferably, the first contact opening has a width and a depth. In a specific embodiment, the width is less than 1 micron in dimension. The method includes exposing a portion of the contact region and forming a silicide layer overlying at least the contact region to form a silicided contact region. The method includes forming an interdielectric layer overlying the silicided contract region to fill the contact opening and provide a thickness of material overlying the stop layer and a interlayer dielectric layer surface region. The method includes forming a masking layer overlying the surface region and forming an opening in the masking layer overlying a vicinity of the silicided contact region, the opening may be overlapping a portion of the stop layer. The method patterns the interlayer dielectric layer to form a second opening in the interlayer dielectric layer through a portion of the thickness to expose a portion of the silicided contact region and expose a portion of the stop layer while maintaining the source/drain region free from any etching damage while patterning the interlayer dielelectric layer. The method forms a contact plug layer overlying the exposed portion of the silicided contact region and the exposed portion of the stop layer.

An alternative specific embodiment of the present invention provides a high voltage integrated circuit device. The device includes a semiconductor substrate comprising a surface region, which has a contact region. Preferably, the contact region is coupled to a source/drain region of a high voltage semiconductor device. The device has a plasma enhanced oxide overlying the surface region, a stop layer overlying the plasma enhanced oxide, and a first contact opening through a portion of the stop layer and through a portion of the plasma enhanced oxide layer. Preferably, the first contact opening has a width and a depth. The width is less than 1 micron in dimension. Preferably, the first contact opening exposes a portion of the contact region without damaging it. The device has a silicide layer overlying at least the contact region to form a silicided contact region and an interlayer dielectric overlying the silicided contract region to fill the contact opening and provide a thickness of material overlying the stop layer and a interlayer dielectric layer surface region. A second opening in the interlayer dielectric layer is formed through a portion of the thickness to expose a portion of the silicided contact region and expose a portion of the stop layer. The device has a contact plug layer overlying the exposed portion of the silicided contact region and the exposed portion of the stop layer. The second opening is mis-aligned with the silicided contact region to cause the exposed portion of the stop layer.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an breakdown voltage characteristics of high voltage devices, e.g., breakdown voltages of greater than 12 volts or greater than 20 volts. Depending upon the embodiment, one or more of these benefits may be achieved. These and other benefits will be described in more throughout the present specification and more particularly below.

Various additional features and advantages of the present invention can be more fully appreciated with reference to the detailed description and accompanying drawings that follow.

DETAILED DESCRIPTION OF THE INVENTION

According to the present invention, techniques directed integrated circuits and their processing for the manufacture of semiconductor devices are provided. More particularly, embodiments of the invention provide a method and system for forming a self aligned contact for a high voltage semiconductor integrated circuit device. But it would be recognized that the invention has a much broader range of applicability. For example, the invention can be applied to a variety of other applications such as application specific integrated circuits, microprocessors, and memory devices.

Figure 1:
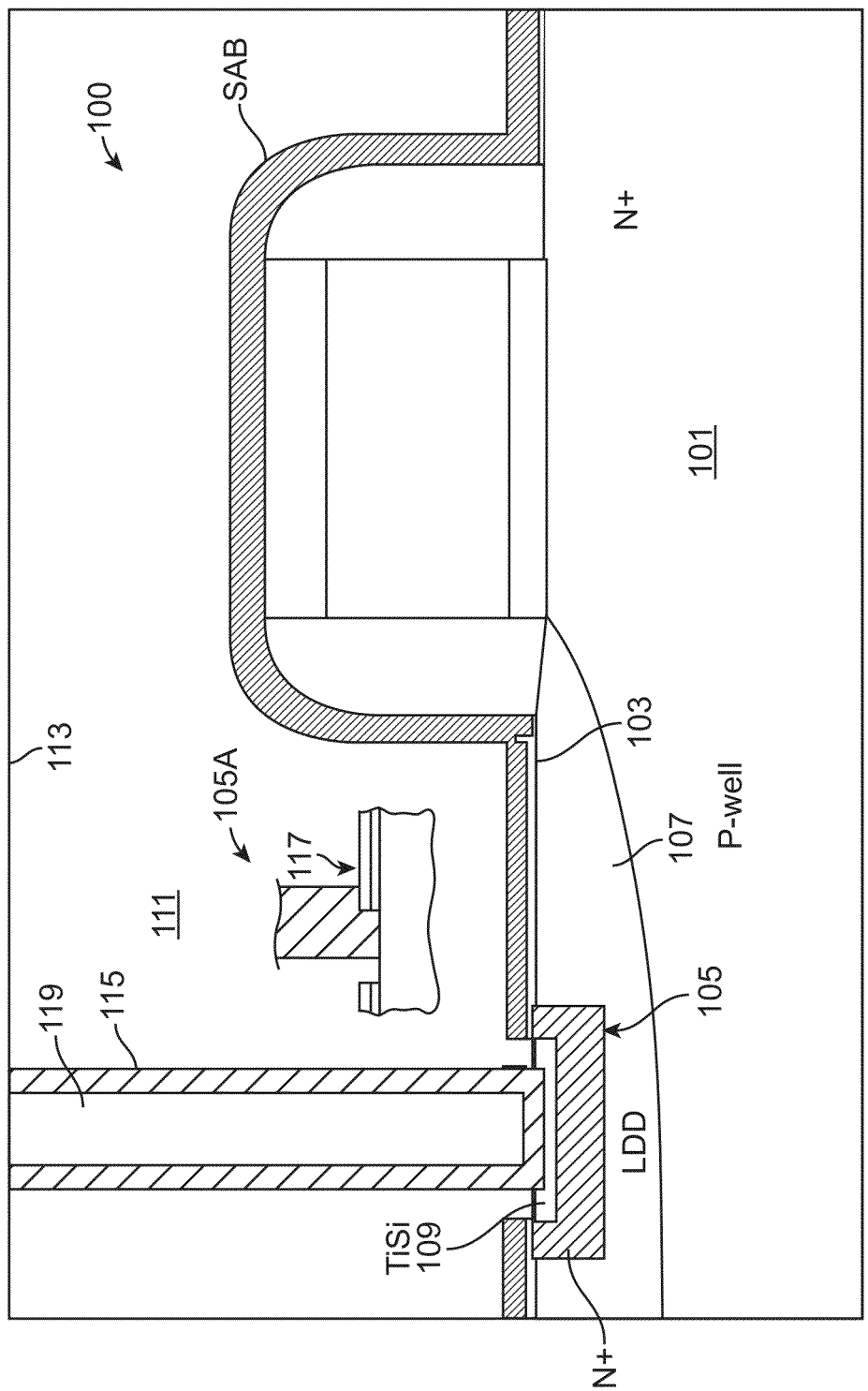
FIG. 1 is a simplified cross-sectional view diagram of a high voltage device according to an embodiment of the present invention.

FIG. 1 is a simplified cross-sectional view diagram of a high voltage device according to an embodiment of the present invention. This diagram is merely an illustration, which should not unduly limit the scope of the invention herein. One of ordinary skill in the art would recognize many variations, modifications, and alternatives. As shown, the present high voltage integrated circuit device 100 includes a semiconductor substrate 101 (e.g., silicon wafer, silicon on insulator) comprising a surface region 103, which has a contact region 105. Preferably, the contact region is coupled to a source/drain region 107 of the high voltage semiconductor device 100. In an embodiment, the source/drain region comprises a lightly doped drain (LDD) structure. Preferably, the high voltage device has a gate region overlying a channel region. In a specific embodiment, the high voltage device has a breakdown voltage of greater than 12 volts or greater than 20 volts depending upon the embodiment. Sidewall spacers are formed on the gate region. The device also has a silicide area block, commonly known as an SAB layer, formed overlying exposed surfaces of the high voltage integrated circuit device. The SAB layer protects selected surfaces during a silicide process. The SAB layer includes a plasma enhanced oxide (e.g., doped oxide, undoped oxide) overlying the surface region and a stop layer overlying the plasma enhanced oxide. Preferably, the stop layer has a different etching characteristic than the plasma enhanced oxide layer. The stop layer can be made of a silicon nitride layer, silicon oxynitride layer, any combination of these, and the like. The device has a first contact opening through a portion of the stop layer and through a portion of the plasma enhanced oxide layer. Preferably, the first contact opening has a width and a depth. In a specific embodiment, the width is less than 1 micron in dimension. Preferably, the first contact opening exposes a portion of the contact region without damaging it.

As also shown, the device has a silicide layer 109 overlying at least the contact region to form a silicided contact region. The silicide layer can be tungsten silicide, titanium silicide, platinum silicide, or any other refractory metal, and the like. The device has an interdielectric layer 111 overlying the silicided contract region to fill the contact opening and provide a thickness of material overlying the stop layer. Preferably, the interdielectric layer has an interdielectric layer surface region 113, which is planarized. The interdielectric layer can be plasma enhanced oxide or high density plasma enhanced oxide, depending upon the embodiment. As shown, a second opening 115 is in the interdielectric layer through a portion of the thickness to expose a portion of the silicided contact region and expose a portion of the stop layer. An inset 105A illustrates a misaligned contact region 117, which is described in more detail in FIG. 4. Such defects can often be caused by a mask mis-alignment in a specific embodiment. The device has a contact plug layer 119 overlying the exposed portion of the silicided contact region and the exposed portion of the stop layer. The contact plug layer is made of a suitable material such as doped polysilicon, tungsten, or other materials. Preferably, the plug layer is lined using a barrier metal layer or other like material. In some cases, the second opening can be mis-aligned with the silicided contact region to cause the exposed portion of the stop layer, as shown.

Figure 2:
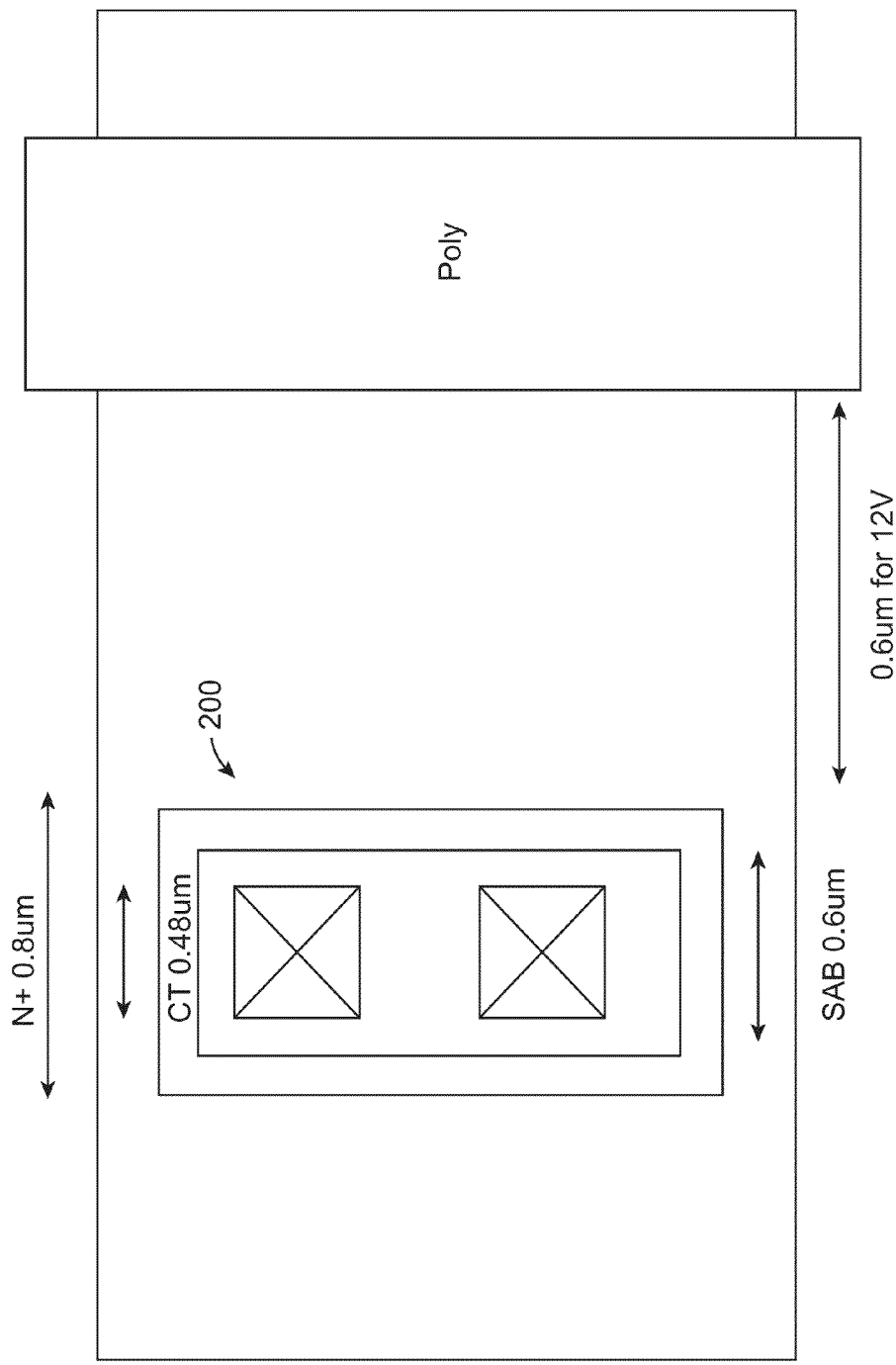
FIG. 2 is a simplified top-view diagram of the high voltage device according to an embodiment of the present invention.

FIG. 2 is a simplified top-view diagram of the high voltage device according to an embodiment of the present invention. This diagram is merely an illustration, which should not unduly limit the scope of the invention herein. One of ordinary skill in the art would recognize many variations, modifications, and alternatives. FIG. 2 shows a top-view of a contact structure 200, which includes two via structures. The device also includes a gate structure manufactured of a polysilicon material. As shown, the via structure is within the contact region. Alternatively, the via structure may overlap a portion of the SAB layer depending upon the embodiment (not shown).

Figure 3:
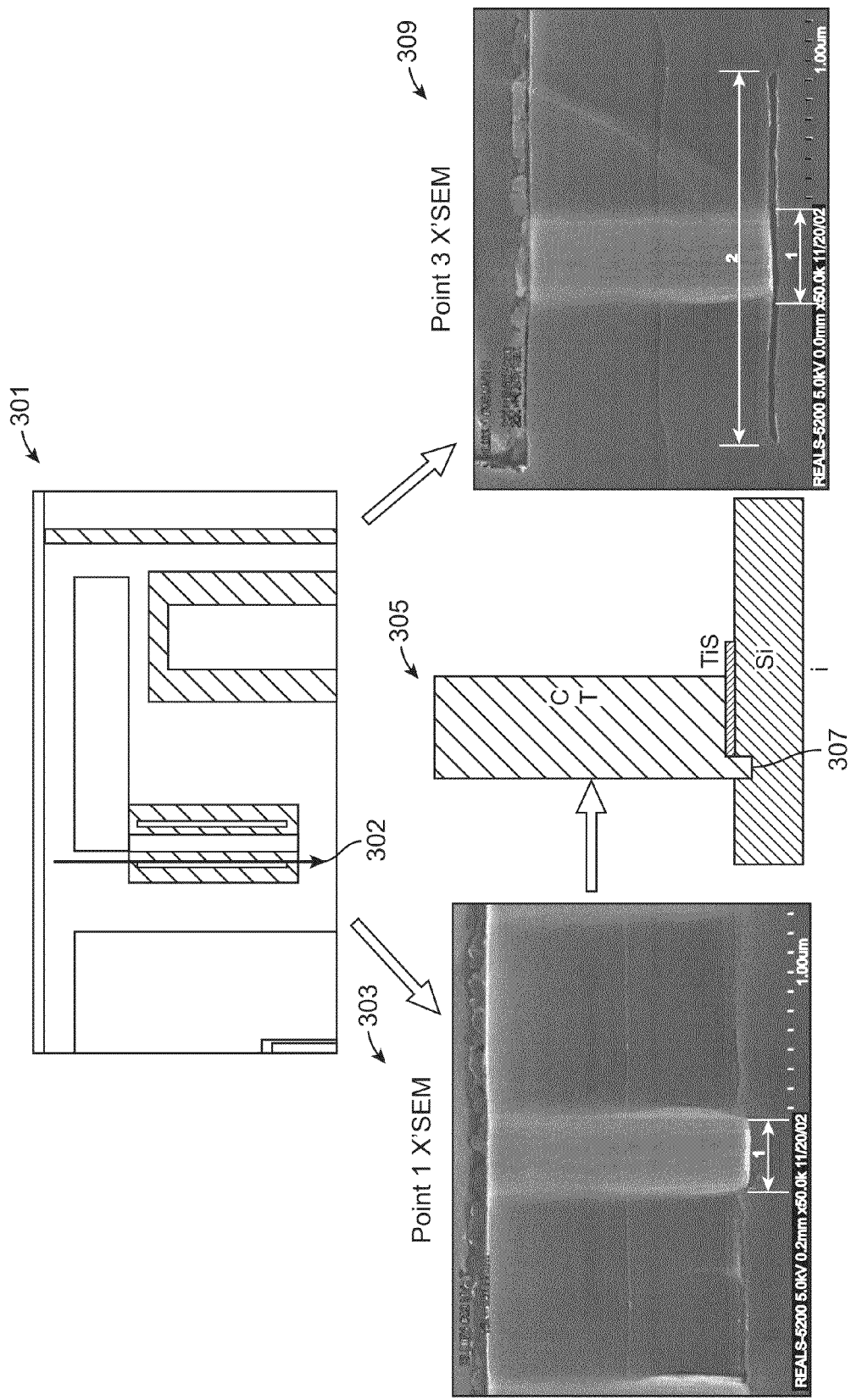
FIG. 3 is a simplified illustration of a conventional high voltage device.

FIG. 3 is a simplified illustration of a conventional high voltage device. Various defects are often associated with conventional contact structures. Examples of such defects are illustrated as reference numerals 301, 303, and 305. Drawing 310 shows a top view of a portion of an integrated circuit, which includes a failed device. SEM micrograph 303 shows a cross-sectional view of along cut line 302, illustrating a portion of the plug encroaching into the underlying silicon material. This defect is further illustrated in drawing 305, which shows a region 307 encroaching into the silicon material. Such defects can cause potential reliability and performance problems. In contrast, SEM micrograph 305 309 shows a contact structure without the afore-mentioned defect.

Figure 4:
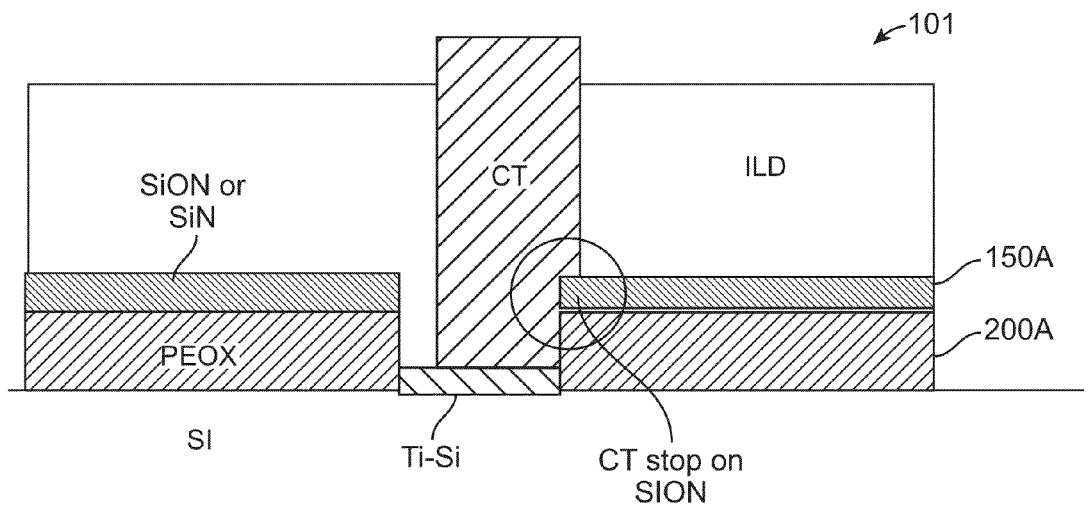
FIG. 4 is a simplified cross-sectional view diagram of a contact structure for a high voltage device according to an embodiment of the present invention.

FIG. 4 is a magnified cross-sectional view diagram of contact structure 105A for a high voltage device 100 of FIG. 1 according to an embodiment of the present invention. This diagram is merely an illustration, which should not unduly limit the scope of the invention herein. One of ordinary skill in the art would recognize many variations, modifications, and alternatives. With reference to both FIGS. 1 and 4, the high voltage integrated circuit device includes a semiconductor substrate 101 comprising a surface region 103, which has a contact region 105A. Preferably, the contact region is coupled to a source/drain region 107 of the high voltage semiconductor device. Preferably, the high voltage device has a gate region overlying a channel region. Sidewall spacers are formed on the gate region. The device also has a silicided area block, commonly known as an SAB layer, formed overlying exposed surfaces of the high voltage integrated circuit device. The SAB layer protects selected surfaces during a silicide process. The SAB layer includes a plasma enhanced oxide 200A overlying the surface region, a stop layer 150A overlying the plasma enhanced oxide, and a first contact opening 159 through a portion of the stop layer and through a portion of the plasma enhanced oxide layer. In an embodiment, the plasma enhanced oxide layer has a thickness of about 200 Angstroms and less. Preferably, the first contact opening has a width and a depth. The width is less than 1 micron in dimension. Preferably, the first contact opening exposes a portion of the contact region without damaging it.

As also shown in FIGS. 1 and 4, the device has a silicide layer 109 overlying at least the contact region to form a silicided contact region. The device has an interdielectric layer 111 overlying the silicided contract region 109 to fill the contact opening and provide a thickness of material overlying the stop layer. Preferably, the interdielectric layer has an interlayer dielectric layer surface region 113, which is planarized. As shown, a second opening 115 is in the interlayer dielectric layer through a portion of the thickness to expose a portion of the silicided contact region and expose a portion of the stop layer. In an embodiment, the second opening has a width of 0.5 micron and less. Contact region 105A illustrates overlap region 117. The device has a contact plug layer 119 overlying the exposed portion of the silicided contact region and the exposed portion of the stop layer. The second opening is mis-aligned with the silicided contact region to cause the exposed portion of the stop layer, as shown.

Figure 5:
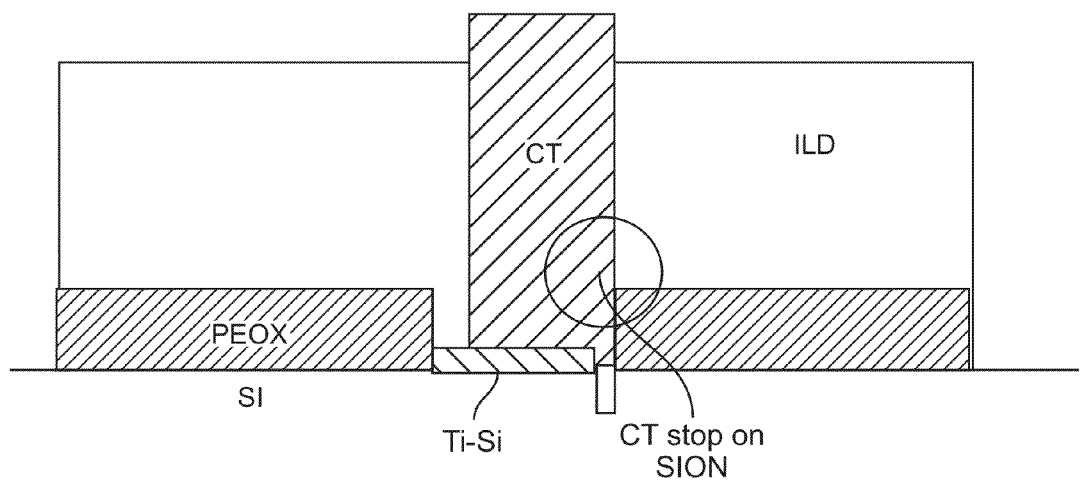
FIG. 5 is a simplified cross-sectional view diagram of a contact structure of a conventional high voltage device.

FIG. 5 is a simplified cross-sectional view diagram of a contact structure of a conventional high voltage device. As shown, the plug layer projects down into a portion of the semiconductor substrate to cause a defect. Such a defect can be caused by a prior etching process, which uses a mis-aligned mask. The subsequent etching process etches through a portion of the plasma enhanced oxide and cuts through a portion of the semiconductor substrate, as shown.

A method for fabricating a contact structure for a high voltage integrated circuit device according to an embodiment of the present invention may be outlined as follows:

1. Provide a semiconductor substrate comprising a surface region, which has a contact region (the contact region is coupled to a source/drain region of a high voltage semiconductor device);
2. Form a plasma enhanced oxide layer via plasma deposition overlying the surface region;
3. Form a stop layer (e.g., nitride) overlying the plasma enhanced oxide;
4. Form a first contact opening via etching through a portion of the stop layer and through a portion of the plasma enhanced oxide layer;
5. Expose a portion of the contact region;
6. Form a silicide layer (e.g., tungsten silicide, titanium silicide, nickel silicide, platinum silicide) overlying at least the contact region to form a silicided contact region;
7. Form an interdielectric layer overlying the silicided contract region to fill the contact opening and provide a thickness of material overlying the stop layer and a interdielectric layer surface region;
8. Form a masking layer (e.g., photomasking) overlying the interdielectric layer surface region;
9. Form an opening via etching, which may be mis-aligned, in the masking layer overlying a vicinity of the silicided contact region;
10. Pattern via etching the interdielectric layer to form a second opening in the interdielectric layer through a portion of the thickness to expose a portion of the silicided contact region and expose a portion of the stop layer;
11. Maintain the source/drain region free from any etching damage while patterning the interdielelectric layer;
12. Form a contact plug layer overlying the exposed portion of the silicided contact region and the exposed portion of the stop layer; and
13. Perform other steps, as desired.

The above sequence of steps provides a method according to an embodiment of the present invention. As shown, the method uses a combination of steps including a way of forming a contact structure for a high voltage semiconductor device. Other alternatives can also be provided where steps are added, one or more steps are removed, or one or more steps are provided in a different sequence without departing from the scope of the claims herein.

Figure 6:
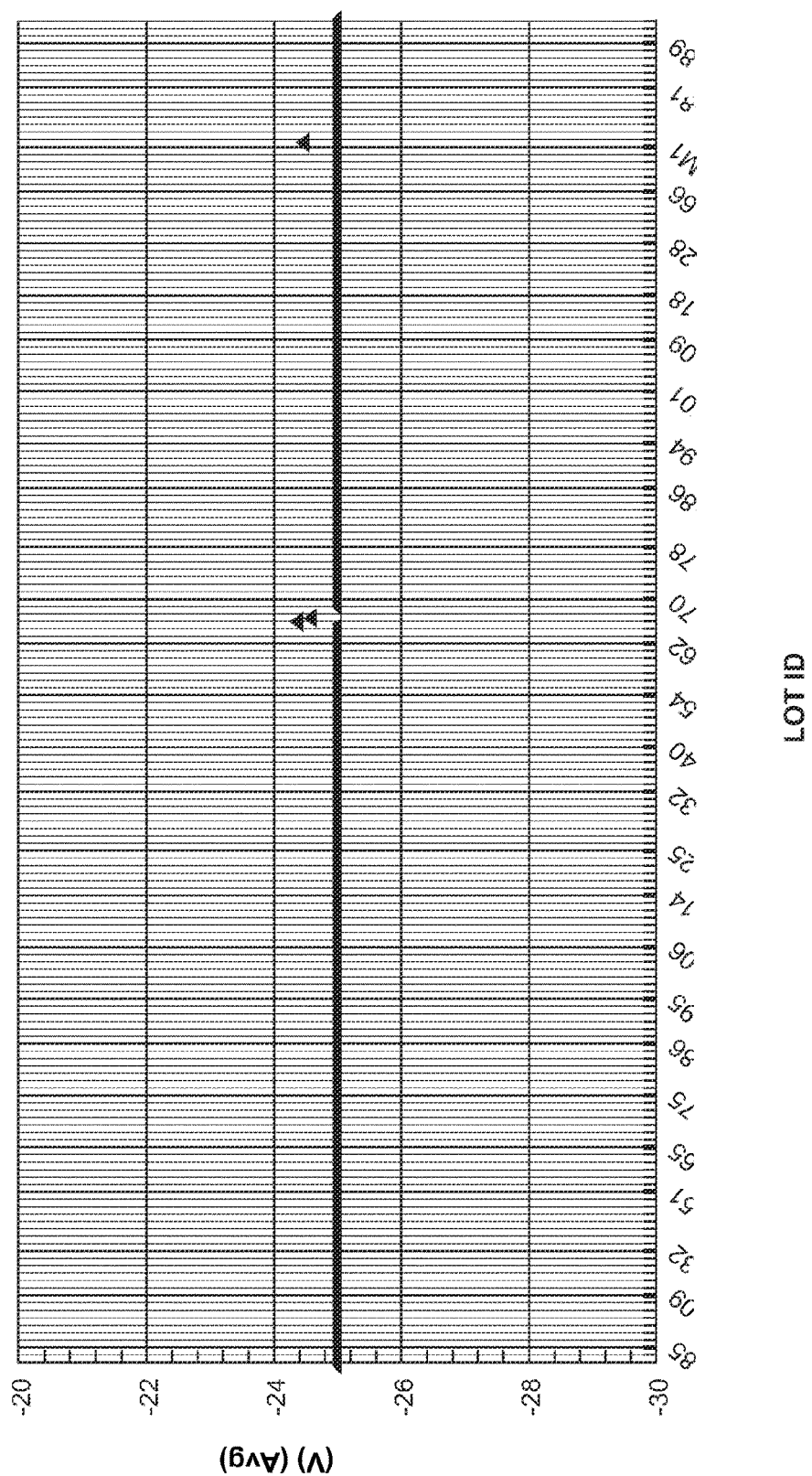
FIG. 6 is a graph depicting experimental data of breakdown voltages across wafer lots according to an embodiment of the present invention.

FIG. 6 is a graph depicting experimental data of breakdown voltages across wafer lots according to an embodiment of the present invention. This graph is merely an example, which should not unduly limit the scope of the claims herein. One of ordinary skill in the art would recognize many variations, alternatives, and modifications. In the experiment, we prepared certain wafers in various lots using the stop layer and technique defined herein. As shown, the vertical axis represents breakdown voltage for the high voltage transistor. The horizontal axis represents lot numbers, where each lot can include scores of wafers. As can be seen, the breakdown voltages are approximately 25 V for over 1000 wafers through more than 25 lots. This experimental result shows that using the methods provided by embodiments of the invention can lead to consistent contact structures as measured by breakdown voltages.

It is also understood that the examples and embodiments described herein are for illustrative purposes only and that various modifications or changes in light thereof will be suggested to persons skilled in the art and are to be included within the spirit and purview of this application.

What is claimed is:

1. A method for fabricating a high voltage integrated circuit device, the method comprising:
   providing a semiconductor substrate comprising a surface region, the surface region comprising a contact region, the contact region being coupled to a source/drain region of a high voltage semiconductor device;
   forming a plasma enhanced oxide layer overlying the surface region;
   forming a stop layer overlying the plasma enhanced oxide layer;
   forming a first contact opening through a portion of the stop layer and through a portion of the plasma enhanced oxide layer to expose a portion of the contact region;
   forming a silicide layer overlying at least the exposed portion of the contact region to form a silicided contact region;
   forming an interdielectric layer having a first thickness portion overlying the silicided contact region to fill the first contact opening and having a second thickness portion overlying the stop layer;
   forming a masking layer overlying the interdielectric layer;
   forming an opening in the masking layer overlying a vicinity of the silicided contact region, the opening overlapping a portion of the stop layer;
   patterning the interdielectric layer to form a second opening extending through the first thickness portion to expose a portion of the silicided contact region and through the second thickness portion to expose the portion of the stop layer;
   maintaining the source/drain region free from any etching damage while patterning the interdielectric layer; and
   forming a contact plug layer overlying the exposed portion of the silicided contact region and the exposed portion of the stop layer, wherein the first contact opening has a width that is greater than a width of the second opening.

2. The method of claim 1 wherein the semiconductor substrate is a silicon wafer.

3. The method of claim 1 wherein the width of the second opening is 0.5 micron or less.

4. The method of claim 1 wherein the high voltage semiconductor device is associated with a voltage of 12 volts and greater.

5. The method of claim 1 wherein the high voltage semiconductor device has a channel width of 1 micron and less.

6. The method of claim 1 wherein the interdielectric layer comprises a plasma enhanced oxide.

7. The method of claim 1 wherein the plasma enhanced oxide layer has a thickness of about 200 Angstroms and less.

8. The method of claim 1 wherein the source/drain region comprises a LDD structure.

9. The method of claim 1 wherein the contact plug layer comprises polysilicon.

10. The method of claim 1 wherein the contact plug layer comprises tungsten.

11. The method of claim 1 wherein the stop layer comprises silicon nitride.

12. The method of claim 1 wherein the overlapping is caused by a mis-alignment of the opening to the silicide contact region.

13. The method of claim 1 wherein the width of the first contact opening is 1.0 micron or less.

14. The method of claim 1 wherein the silicide layer comprises a refractory metal.

15. The method of claim 1 wherein the silicide layer comprises tungsten silicide, titanium silicide, or platinum silicide.

16. The method of claim 1 wherein the stop layer comprises silicon oxynitride.

* * * * *